(12) United States Patent
Chang et al.

(10) Patent No.: US 8,590,953 B2
(45) Date of Patent: Nov. 26, 2013

(54) NON-CONTACT MANIPULATING DEVICES AND METHODS

(75) Inventors: Chester Hann Huei Chang, Painted Post, NY (US); Paul Martin Elliott, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 13/447,802

(22) Filed: Apr. 16, 2012

(65) Prior Publication Data
US 2012/0201645 A1     Aug. 9, 2012

Related U.S. Application Data

(62) Division of application No. 12/200,710, filed on Aug. 28, 2008, now Pat. No. 8,231,157.

(51) Int. Cl.
*A47J 45/00* (2006.01)

(52) U.S. Cl.
USPC ............................ 294/64.3; 269/20

(58) Field of Classification Search
USPC ............... 294/183, 64.2, 64.3, 65; 901/40; 269/20, 21; 285/121.3, 121.4, 121.6, 285/121.7, 272.1; 239/587.3, 587.4, 423, 239/424, 425, 526, 203; 137/561 A
See application file for complete search history.

(56) References Cited

U.S. PATENT DOCUMENTS

| | | |
|---|---|---|
| 3,523,706 A | 8/1970 | Logue |
| 3,993,301 A | 11/1976 | Vits .................................. 271/98 |
| 4,029,351 A | 6/1977 | Apgar et al. ..................... 294/64 |
| 4,742,299 A | 5/1988 | Stone ............................. 324/230 |
| 4,743,989 A | 5/1988 | Bauck et al. ................... 360/133 |
| 5,492,566 A | 2/1996 | Sumnitsch ..................... 118/500 |
| 5,979,475 A | 11/1999 | Satoh et al. .................... 134/140 |
| 6,076,743 A | 6/2000 | Fan ................................. 239/99 |
| 6,358,288 B1 * | 3/2002 | Kasim et al. .................. 29/25.01 |
| 6,363,959 B1 | 4/2002 | Ollivier ........................... 137/14 |
| 6,427,991 B1 | 8/2002 | Kao ................................. 269/21 |
| 6,595,439 B1 | 7/2003 | Chen .......................... 239/225.1 |
| 6,601,888 B2 * | 8/2003 | McIlwraith et al. .......... 294/64.3 |
| 6,736,332 B2 | 5/2004 | Sesser et al. ................... 239/204 |
| 7,083,200 B2 | 8/2006 | Falconer ..................... 285/121.3 |
| 7,104,579 B2 | 9/2006 | Casarotti et al. .............. 294/64.1 |
| 7,216,821 B1 | 5/2007 | Reece et al. ................. 239/533.1 |
| 7,398,735 B1 | 7/2008 | Sunderland ...................... 104/10 |
| 7,690,869 B2 | 4/2010 | Yo et al. ........................... 406/88 |
| 7,784,835 B1 | 8/2010 | Keays et al. ................... 285/261 |
| 2007/0290517 A1 | 12/2007 | Nagai et al. .................. 294/64.1 |

FOREIGN PATENT DOCUMENTS

| | | |
|---|---|---|
| JP | 2003-245885 | 9/2003 |
| JP | 2004-193195 | 7/2004 |
| JP | 2005-74606 | 3/2005 |
| JP | 2008-168413 | 7/2008 |

* cited by examiner

*Primary Examiner* — Stephen Vu
(74) *Attorney, Agent, or Firm* — Matthew J. Mason; Steven Wentsler

(57) ABSTRACT

Non-contact manipulating devices and methods can include a fluid distribution member including a first fluid port configured to dispense fluid and create a Bernoulli effect to attract an article to be manipulated by the manipulating device while maintaining a gap between the article and the fluid distribution member. The fluid distribution member can further include a second fluid port configured to dispense fluid to assist in maintaining the gap. The non-contact manipulating devices and methods can further include a controller configured to control a fluid flow through at least the second fluid port to help maintain the gap.

12 Claims, 17 Drawing Sheets

NON-CONTACT MANIPULATING DEVICES AND METHODS

CROSS-REFERENCE TO RELATED APPLICATIONS

This is a divisional of U.S. patent application Ser. No. 12/200,710 filed on Aug. 28, 2008 now U.S. Pat. No. 8,231,157, the content of which is relied upon and incorporated herein by reference in its entirety, and the benefit of priority under 35 U.S.C. §120 is hereby claimed.

BACKGROUND

1. Field of the Invention

The present invention relates generally to methods and devices for manipulating articles, and more particularly to non-contact manipulating devices and methods for manipulating various articles.

2. Technical Background

Conventional devices and methods are known for handling an article without actually contacting the article. For example, conventional devices and methods frequently employ the well-known Bernoulli principle in order to lift and hold articles without contacting the article. Such devices and methods are known to use an air flow across the surface of the article to attract the article toward the device. At the same time, the pressure from the same air flow provides a cushion to resist contact between the article and the device.

SUMMARY

In one example aspect, a non-contact manipulating device comprises a fluid distribution member including a first fluid port. The first fluid port is configured to dispense fluid and create a Bernoulli effect to attract an article to be manipulated by the manipulating device while maintaining a gap between the article and the fluid distribution member. The fluid distribution member further includes a second fluid port configured to dispense fluid to assist in maintaining the gap. The non-contact manipulating device further includes a controller configured to control a fluid flow through at least the second fluid port to help maintain the gap.

In another example aspect, a non-contact manipulating device comprises a support arm including a first articulating surface. The non-contact manipulating device further comprises a fluid distribution member including a second articulating surface that engages the first articulating surface and articulately mounts the fluid distribution member to the support arm. The fluid distribution member includes a fluid port configured to create a Bernoulli effect by dispensing fluid to attract an article to be manipulated by the manipulating device while maintaining a gap between the article and the fluid distribution member. The non-contact manipulating device further comprises a biasing member that biases the first articulating surface against the second articulating surface to permit articulation of the fluid distribution member with respect to the support arm.

In yet another example aspect, a non-contact manipulating device is provided with a support arm including a first fluid channel and a second fluid channel. The non-contact manipulating device further includes a fluid distribution member pivotally connected to the support arm. The fluid distribution member includes a first fluid port in communication with the first fluid channel and configured to create a Bernoulli effect by dispensing fluid to attract an article to be manipulated by the manipulating device while maintaining a gap between the article and the fluid distribution member. The non-contact manipulating device further includes a locking device that selectively pivotally locks the fluid distribution member at a desired angular position with respect to the support arm, wherein the second fluid channel powers the locking device.

In still another example aspect, a non-contact manipulating device is provided with a fluid distribution member. The fluid distribution member includes a fluid port configured to create a Bernoulli effect by dispensing fluid to attract an article to be manipulated by the manipulating device while maintaining a gap between the article and the fluid distribution member. The fluid distribution member includes a cap adjustably mounted with respect to the fluid port, wherein the cap adjusts with respect to the fluid port to change a characteristic of the fluid dispensed by the fluid port.

In another example aspect, a method of manipulating an article comprises the steps of providing a non-contact manipulating device with a fluid distribution member including a first fluid port and a second fluid port. The method further includes the step of creating a Bernoulli effect by dispensing fluid through the first fluid port to attract an article to be manipulated by the manipulating device while maintaining a gap between the article and the fluid distribution member. The method further includes the step of modifying a fluid flow through at least the second fluid port to help maintain or vary the gap.

BRIEF DESCRIPTION OF THE DRAWINGS

These and other features, aspects and advantages of the present invention are better understood when the following detailed description of the invention is read with reference to the accompanying drawings, in which.

DETAILED DESCRIPTION OF THE INVENTION

Figure 1:
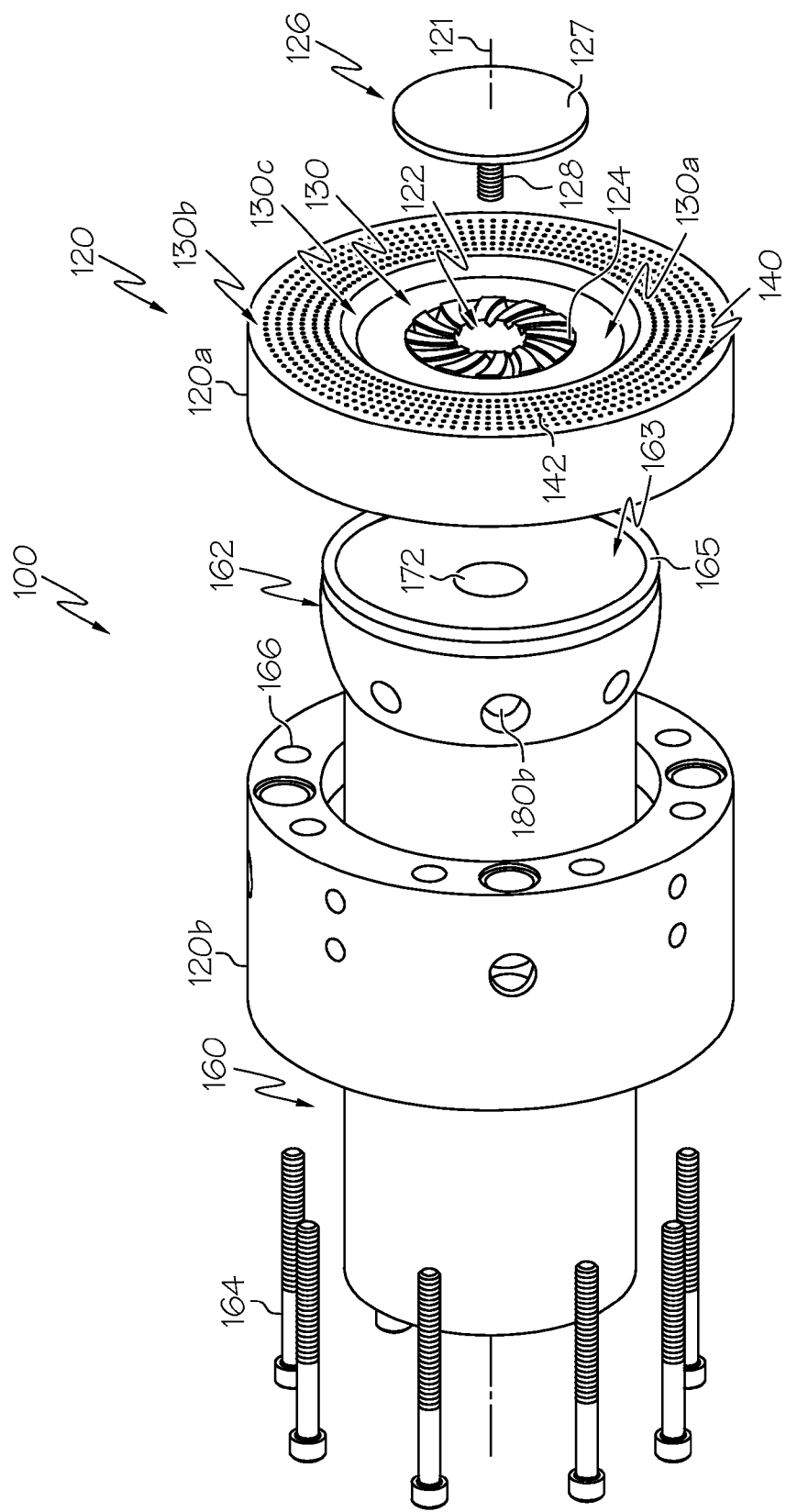
FIG. 1 is an exploded perspective view of a non-contact manipulating device incorporating example aspects of the present invention.
Figure 2:
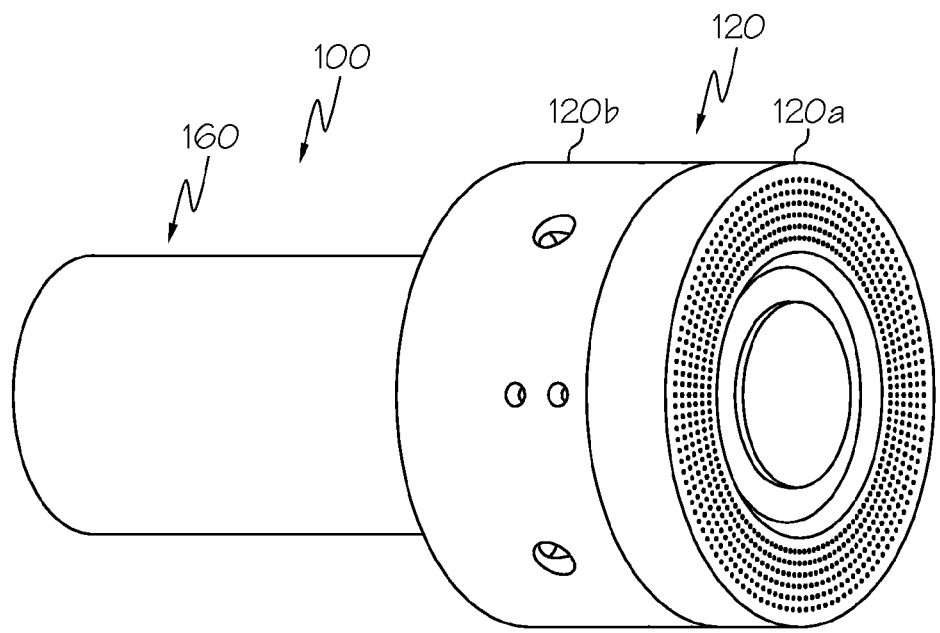
FIG. 2 is a front perspective view of the non-contact manipulating device of FIG. 1.
Figure 3:
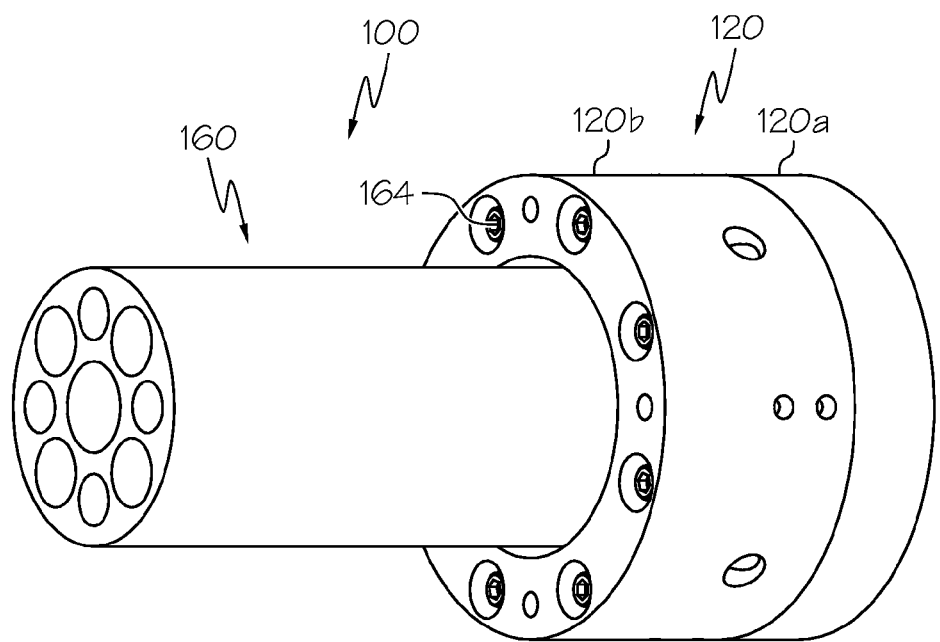
FIG. 3 is a rear perspective view of the non-contact manipulating device of FIG. 1.

The present invention will now be described more fully hereinafter with reference to the accompanying drawings in which example embodiments of the invention are shown. Whenever possible, the same reference numerals are used throughout the drawings to refer to the same or like parts. However, this invention may be embodied in many different forms and should not be construed as limited to the embodiments set forth herein. These example embodiments are provided so that this disclosure will be both thorough and complete, and will fully convey the scope of the invention to those skilled in the art.

Non-contact manipulating devices and methods are provided for manipulating an article such as a sheet of material. The sheet of material can comprise ribbon, webbing, substrates, plates or other articles. In one example, the sheet material can comprise glass, such as glass designed for a liquid crystal display (LCD). Example articles can comprise a fabricated glass sheet or material being fabricated, such as fusion drawn, into a glass sheet.

Non-contact devices herein can be used to manipulate articles in various ways. For example, manipulation may involve picking up the article for conveying, forming, finishing, inspection, measurement, or other procedures. In further examples, manipulation can involve biasing the article to move in a particular direction and/or form a desired shape. For instance, manipulation may involve biasing a lateral movement of the material, shaping an article during fabrication, or other manipulation techniques. In one example, manipulation may involve stabilization of a glass sheet during cutting or other procedures of a glass drawing operation.

FIGS. 1-4 illustrate one example of a non-contact manipulating device 100 incorporating example aspects of the present invention. The non-contact manipulating device 100 can include a fluid distribution member 120 with a first fluid port 122 configured to dispense fluid to attract an article toward the fluid distribution member 120. For instance, as described more fully below, fluid emanating from the first fluid port 122 can generate a Bernoulli effect to attract the article toward the fluid distribution member 120. When the article is sufficiently close to the face of the fluid distribution member 120, the fluid creates a repelling force upon the article. Thus, the fluid distribution member 120 can include a first fluid port 122 configured to dispense fluid and create a Bernoulli effect to attract an article (e.g., see 110 in FIG. 5A) to be manipulated by the manipulating device 100 while maintaining a gap between the article 110 and the fluid distribution member 120.

The fluid distribution member 120 can comprise various shapes and sizes. As shown, the fluid distribution member 120 can include a substantially circular periphery although other shapes may be used in further examples. For instance, the fluid distribution member can include an elliptical or other curvilinear periphery. In further examples, the fluid distribution member can comprise a triangular, rectangular or other polygonal-shaped periphery. The size of the fluid distribution member can be selected depending on the application. In one example, the size is selected based upon the Bernoulli effect generated by the fluid dispensed from the first fluid port 122. For instance, the velocity of the fluid, and corresponding Bernoulli effect, decreases as the fluid travels radially away from the first fluid port 122. Accordingly, the radius of the fluid distribution member 120 can be selected to minimize the size of the fluid distribution member 120 while providing a sufficient radius to provide the desired Bernoulli effect sized to the particular article of interest.

The outer surface 130 of the fluid distribution member 120 can include various shapes to facilitate the Bernoulli effect. The outer surface can be substantially planar although non-planar configurations may be provided in further examples. Still further, the outer surface can be substantially continuous although the surface may be disjointed or otherwise discontinuous in further examples. In the illustrated example, the outer surface 130 comprises a substantially continuous stepped surface with an inner area 130a being recessed with respect to an outer peripheral landing area 130b. An optional shaped transition surface 130c may be provided between the inner area 130a and outer peripheral landing area 130b to facilitate a desired fluid path profile traveling across the outer surface 130.

As shown, the outer surface 130 of the fluid distribution member 120 can be provided with the first fluid port 122. In one example, the first fluid port 122 can be disposed along a central axis 121, such as the illustrated symmetrical axis, of the fluid distribution member 120. For instance, as shown, the first fluid port 122 can comprise a single fluid port disposed along the central axis 121 although a plurality of fluid ports may be provided in accordance with further aspects of the present invention. For instance, the first fluid port may comprise an array of fluid ports disposed about the central axis 121 of the fluid distribution member 120. The first fluid port 122 may comprise the illustrated circular aperture although aspects of the present invention may be practiced with non-circular constructions. For example, the first fluid port may comprise an elliptical aperture or other curvilinear aperture. Still further, the first fluid port may comprise a star shape, triangular, rectangular or other polygonal shape. The first fluid port 122 may also comprise a nozzle, or other fluid distribution element.

Optionally, the first fluid port 122 may be shaped, arranged, provided with structures or otherwise configured to promote a vortex fluid flow. For instance, the interior contours of the first fluid port may have a helical construction to promote rotation of the fluid as the fluid is distributed from the first fluid port. In further examples, the first fluid port may comprise a plurality of fluid ports, such as jets, angled to promote rotation of the fluid as it exits the fluid ports. In further examples, as shown, the first fluid port 122 may comprise a plurality of ribs or vanes 124 radially arranged about an opening of the first fluid port 122. As shown, grooves are defined between adjacent ribs 124 that facilitate rotation of the fluid exiting the first fluid port 122. Providing a vortex fluid flow may be beneficial to enhance attraction of the article toward the fluid distribution member 120. For instance, the vortex may create a low pressure zone in the eye of the vortex that enhances the pressure differential caused by the Bernoulli effect.

Figure 5A:
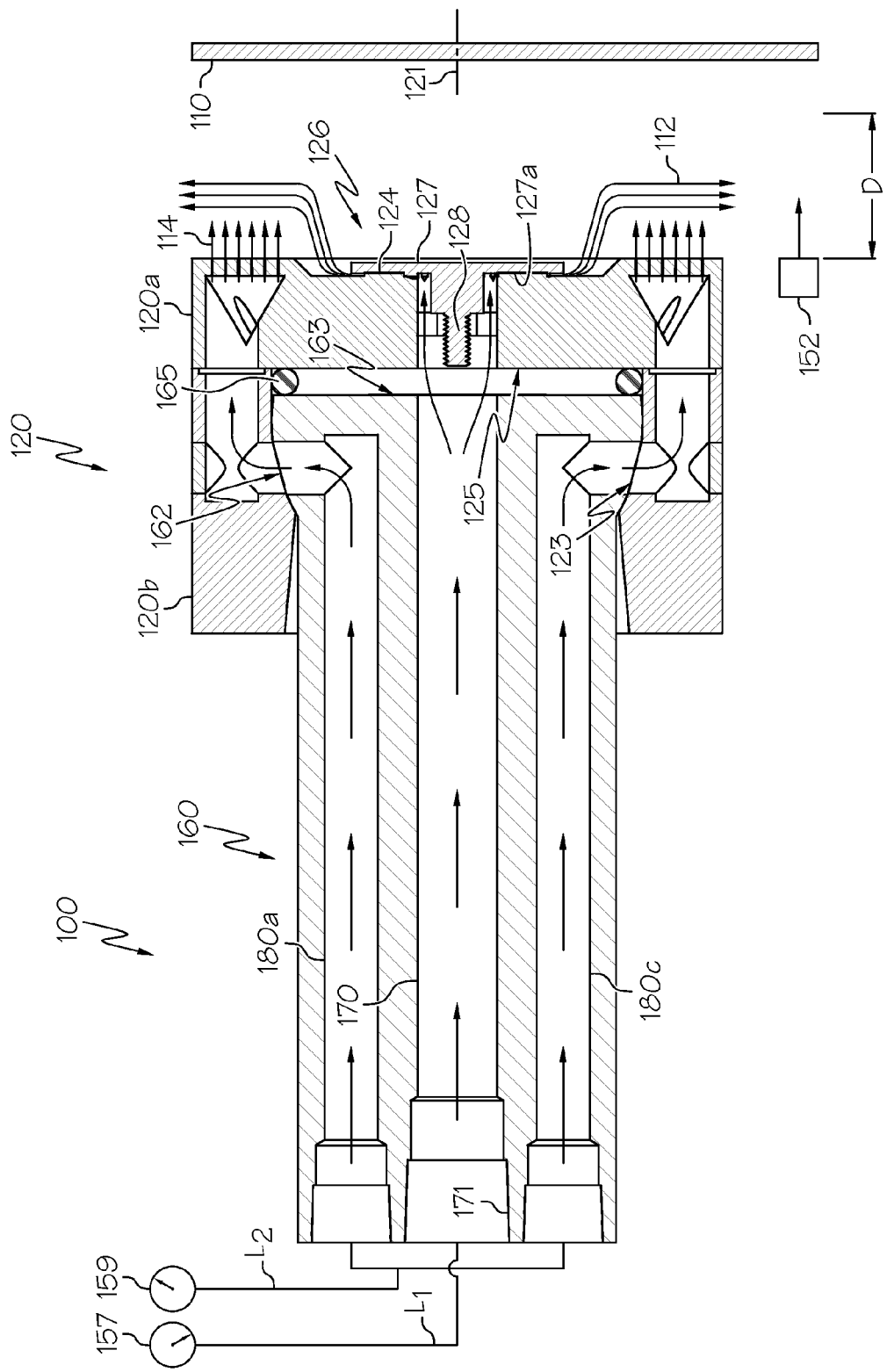
FIGS. 5A-5D are sectional views of the non-contact manipulating device along line 5-5 of FIG. 4 illustrating steps in an example method of manipulating an article.
Figure 5B:
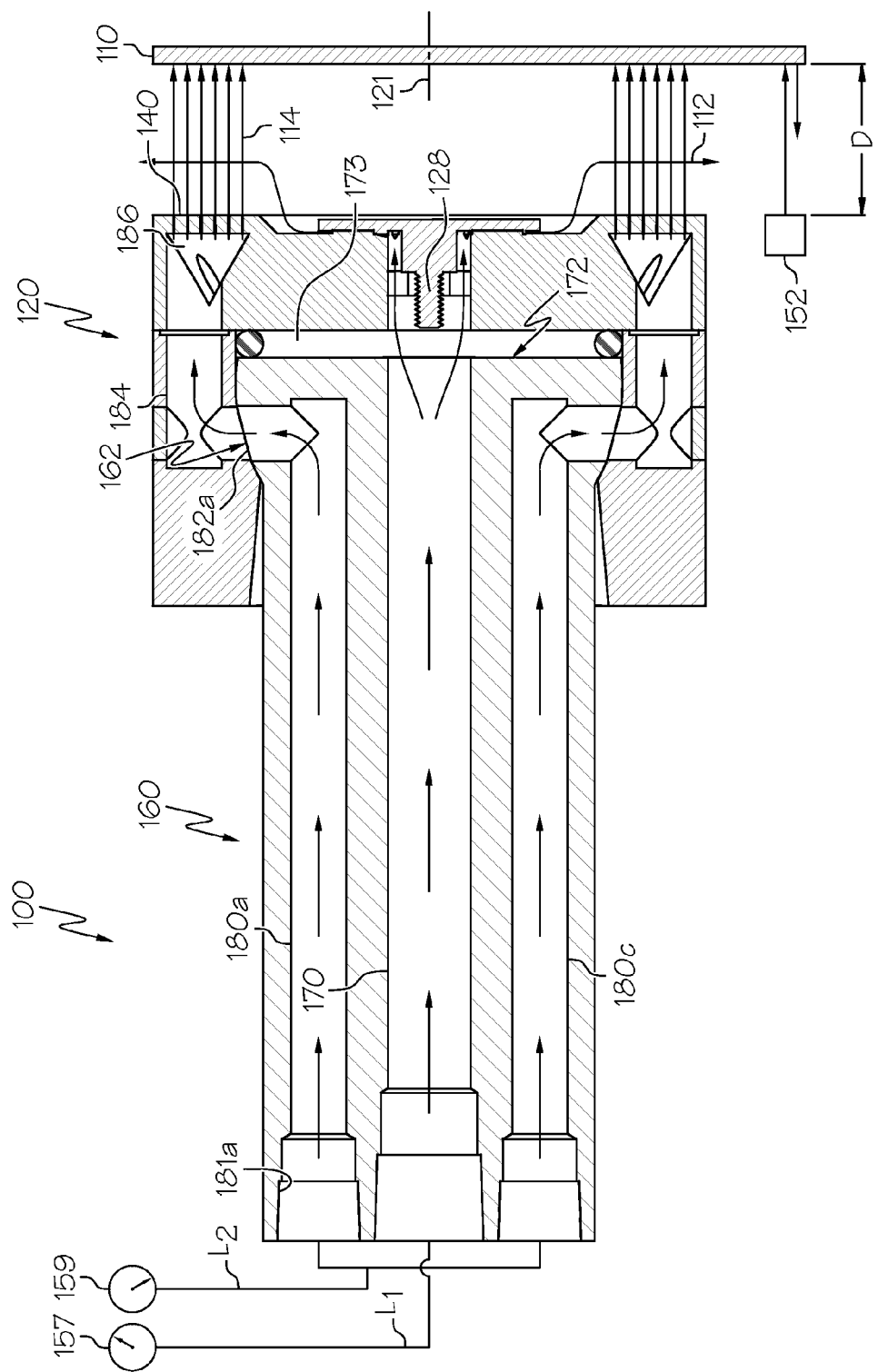
Figure 5C:
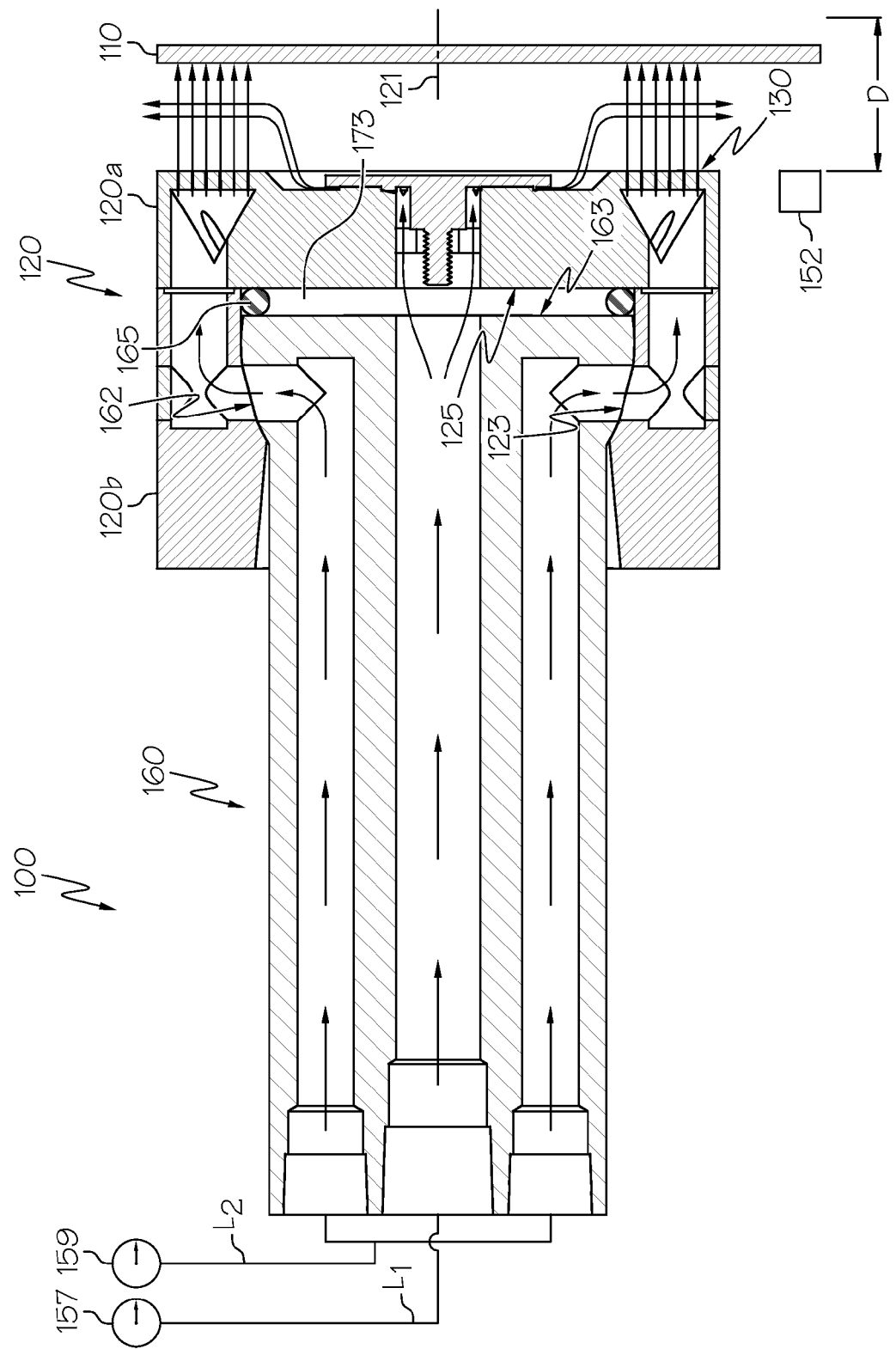
Figure 5D:
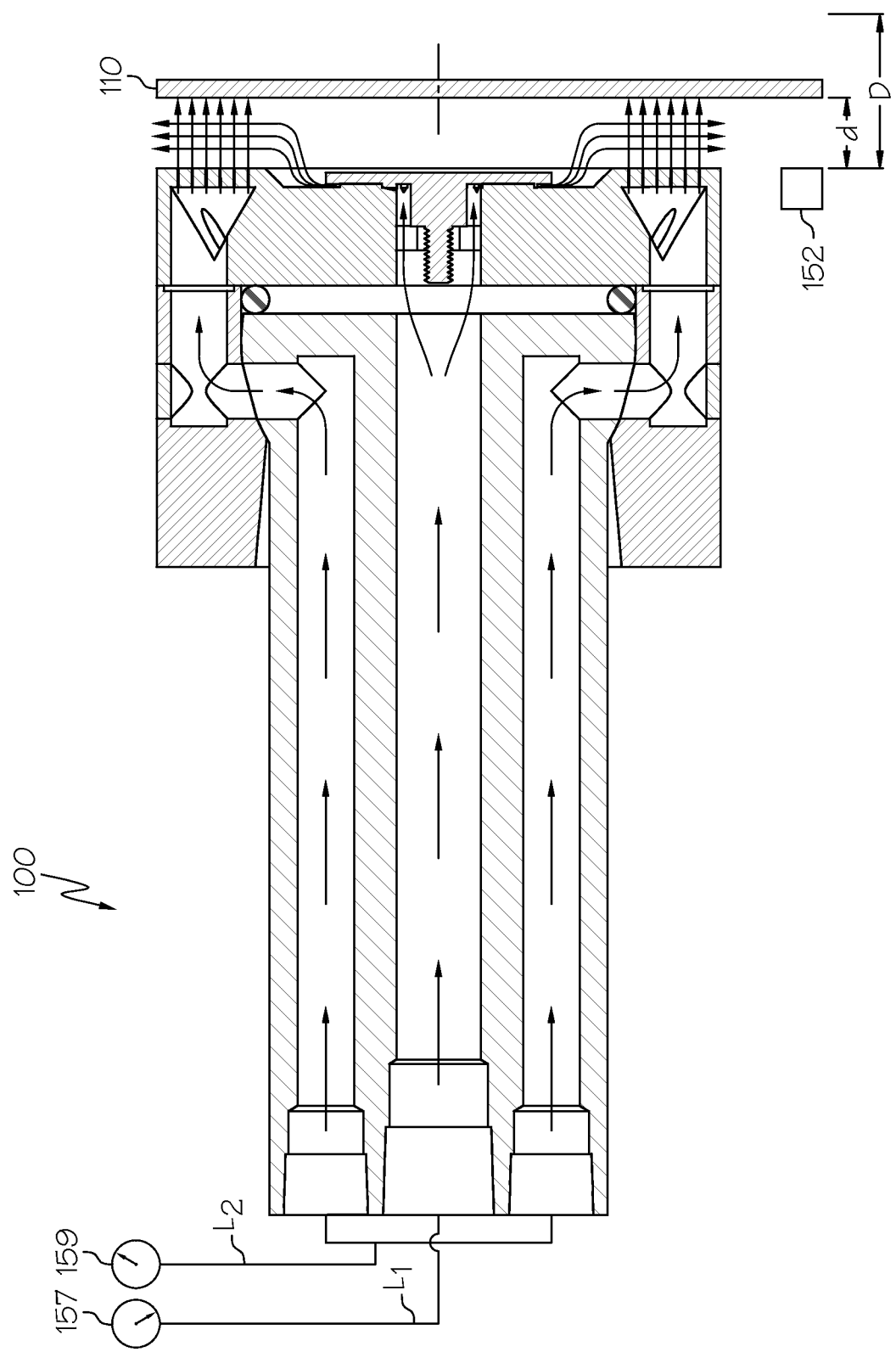
Figure 5E:
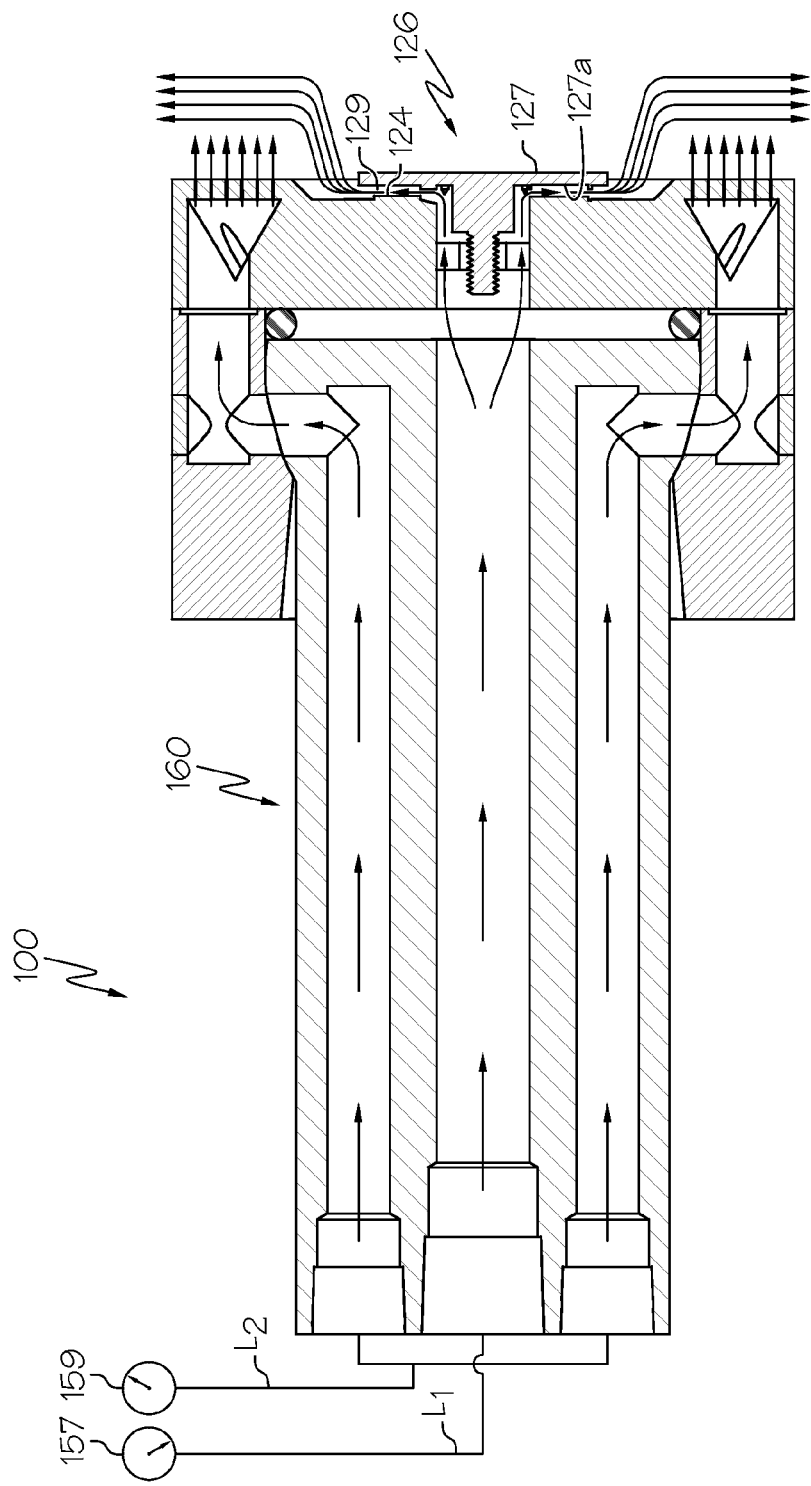
FIG. 5E is a sectional view of the non-contact manipulating device similar to FIG. 5A except that a cap of the device is adjusted to increase fluid flow through the corresponding fluid port.

As further illustrated, the fluid distribution member 120 can include an optional cap 126. The cap 126 can include a threaded shaft 128 that may be fastened within a corresponding threaded portion of the fluid distribution member 120. As shown in FIG. 5A, the cap 126 can be mounted such that an inner surface 127a of a plate 127 engages the ribs 124. Tightening the inner surface 127a against the ribs forces all of the fluid flow through the channels defined between the ribs 124 to maximize the vortex effect. As shown in FIG. 5E, the cap 126 can be adjustably mounted with respect to the first fluid port 122 to permit formation of a gap 129 between the ribs 124 and the inner surface 127a of the plate 127. In one example, a plurality of shims may be placed to allow the plate to tighten against the shims while maintaining the gap 129. Adjusting the gap can change a characteristic of the fluid dispensed by the first fluid port 122. For example, as shown, the gap 129 can be designed to increase the fluid flow rate, reduce fluid velocity, and/or reduce the overall vortex effect.

Examples of the fluid distribution member 120 can further include a second fluid port 140 configured to dispense fluid to repel the article away from the fluid distribution member 120. The second fluid port can comprise various structures. In one example, the second fluid port can comprise porous material, one or more apertures, nozzle configurations, or the like. As shown in FIGS. 1-6, the second fluid port 140 comprises a plurality of apertures 142. As shown, the second fluid port 140 can be disposed radially from the central axis 121 of the fluid distribution member 120. For instance, as shown, the plurality of apertures 142 can be arranged in a ring of fluid apertures extending about the central axis 121. The plurality of apertures 142 are also radially arranged in a hub and spoke pattern although random or predetermined patterns of apertures may be incorporated in further examples. As further shown, the second fluid port 140 is disposed on the outer peripheral landing area 130b although the second fluid port 140 may be located in other positions in further examples.

Providing the second fluid port 140 can be desirable to provide a cushion area for a soft initial interaction with an article. The cushion area provided by the second fluid port 140 can reduce the possibility of inadvertent contact between the article and the fluid distribution member 120 as the article 110 initially moves toward the equilibrium gap distance "d" (see FIG. 5D) from the fluid distribution member 120. Providing a prominent outer peripheral landing area 130b can also increase the equilibrium gap distance due to the aerodynamic effects created by fluid introduced by the first fluid port 122 only.

It is contemplated that the fluid dispensed through the first fluid port 122 and/or the second fluid port 140 can be adjusted to provide a desired interaction between the fluid distribution member 120 and the article 110. In one example, one or more characteristics of the fluid being dispensed by the first fluid port 122 and/or the second fluid port 140 can be altered by a computer based on a movement command and/or sensed movement of the fluid distribution member 120 relative to the article 110. For instance, a sensor can be provided to monitor the distance, velocity, acceleration or other characteristic between the article and the fluid distribution member. In addition, or alternatively, the sensor can monitor actual characteristics of the article such as temperature, surface characteristics (including shape) or the like. Feedback from the sensor(s) can be transmitted to a computer to alter one or more characteristics of the fluid being dispensed by the first fluid port 122 and/or the second fluid port 140. For example, the computer can alter the fluid being dispensed by the first fluid port 122 in order to increase or decrease the Bernoulli effect. In addition or alternatively, the computer can alter the fluid being dispensed by the second fluid port 140 in order to increase or decrease the force tending to repel the article away from the fluid distribution member 120.

Figure 7:
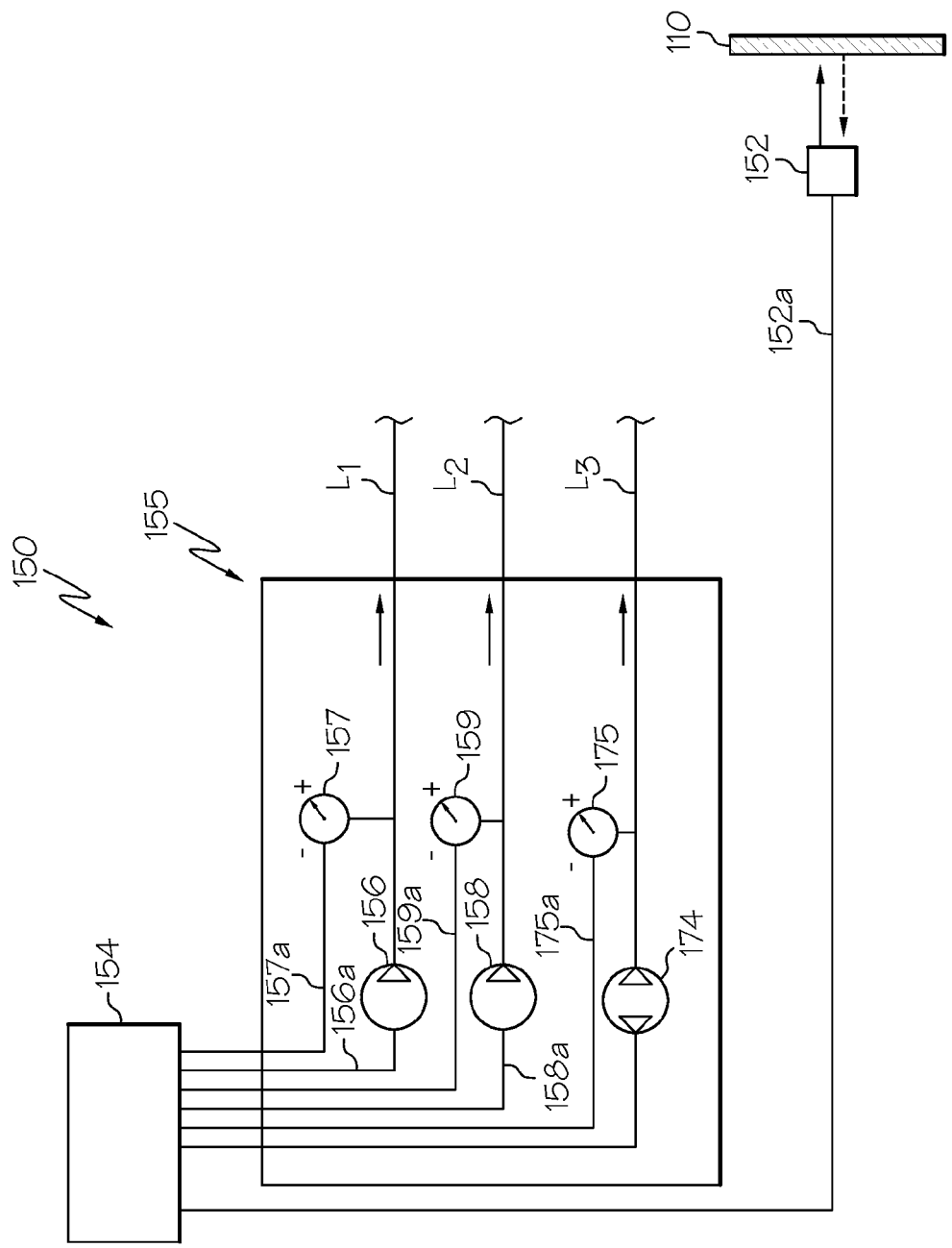
FIG. 7 is a schematic view of portions of an example controller in accordance with aspects of the present invention.

FIG. 7 illustrates a schematic view of portions of one example controller 150 in accordance with aspects of the present invention. The controller 150 can include a proximity sensor 152 positioned to sense an approaching article 110. The sensor 152 can be provided with a feedback path 152a configured to send the signal back to a computer 154. Based the feedback signal from the sensor, the computer can determine a desired pressure within a first fluid pressure line $L_1$ and/or a second fluid pressure line $L_2$. The computer 154 can then send appropriate commands to a pressure control apparatus 155. For example, the computer 154 can send a command along a first command path 156a to a first fluid pump or pressure regulator 156 to control pressure within the first fluid pressure line $L_1$ and/or an appropriate command along a second command path 158a to a second fluid pump 158 to control pressure within the second fluid pressure line $L_2$. A first pressure gauge 157 can monitor the fluid pressure in the first fluid pressure line $L_1$ and provide pressure feedback by way of feedback path 157a to the computer 154. Likewise, a second pressure gauge 159 can monitor the fluid pressure in the second fluid pressure line $L_2$ and provide pressure feedback by way of feedback path 159a to the computer 154. Based on feedback from the first pressure gauge 157 and/or the second pressure gauge 159, the computer may modify the first fluid pump 156 and/or the second fluid pump 158 in a control loop to achieve the desired fluid pressure within the corresponding pressure lines. The first fluid pressure line $L_1$ and the second fluid pressure line $L_2$ are placed in respective communication with the first fluid port 122 and the second fluid port 140. Accordingly, the controller 150 can facilitate change in pressure within the pressure lines in order to alter the fluid being dispensed by the first fluid port 122 and the second fluid port 140. Alternatively, one or more fluid pumps may be used to pressurize one or more pressure tanks, and the fluid pressure lines $L_1$ and $L_2$ may communicate with the one or more pressure tanks via pressure regulators controlled by the computer 154.

In further examples, the non-contact manipulating device 100 can include a support arm 160 configured to support the fluid distribution member 120. The support arm can be attached to a manifold (not shown) or other support mechanism configured to appropriately position the support arm 160 together with the fluid distribution member 120. In further examples, the fluid distribution member 120 can be pivotally connected to the support arm 160. For example, as shown in FIGS. 1 and 5A, the support arm 160 can include a first articulating surface 162 configured to engage a second articulating surface 123 of the fluid distribution member 120. The first articulating surface 162 and the second articulating surface 123 can comprise a spherical socket to facilitate a full range of pivoting of the fluid distribution member 120 relative to the support arm 160. The first articulating surface and/or the second articulating surface can also have a low friction surface to reduce pivoting resistance. The spherical socket can be positioned at or near the center of gravity of the fluid distribution member so that the fluid distribution member 120 will rotate freely to the desired position relative to the article 110.

To achieve the articulating connection, the fluid distribution member 120 can include a first portion 120a and a second portion 120b that are mounted together by inserting bolts 164 through apertures 166 in the second portion 120b and into corresponding threaded apertures in the first portion 120a. Referring to FIGS. 1 and 5C, an optional biasing member 165 may be provided between the end face 163 of the support arm 160 and an inner surface 125 of the first portion 120a. The biasing member 165 is configured to bias the first articulating surface 162 of the support arm 160 against the second articulating surface 123 of the second portion 120b of the fluid distribution member 120 to prevent fluid leakage while permitting pivoting of the fluid distribution member 120 with respect to the support arm 160. As shown, the biasing member 165 can comprise an O-ring of silicone or other material. The material of the biasing member can be selected depending on the particular application. For instance, the material can be made softer for easy movement or harder for more resistance. In another example, the biasing member can comprise a wave spring washer made of stainless steel for high-heat applications.

The optional biasing member 165 can also be configured to return the fluid distribution member 120 to a predetermined angular orientation between the fluid distribution member 120 and the support arm 160. For example, as shown in FIG. 5C, the biasing member 165 can be configured to orient the fluid distribution member 120 such that the outer surface 130 is substantially perpendicular to the central axis 121. The fluid distribution member 120 can be pivoted such that the outer surface 130 is not perpendicular to the central axis 121. However, once released, the forces from the biasing member 165 can reorient the fluid distribution member 120 such that the outer surface 130 is again substantially perpendicular to the central axis 121.

Still further, the second articulating surface 123 of the fluid distribution member 120 can be configured to be disengaged from the first articulating surface 162 of the support arm 160 when moving the fluid distribution member 120 toward the support arm 160 against a force of the biasing member 165. For example, if the article 110 accelerates toward the fluid distribution member 120, the biasing member 165 may compress, allowing the fluid distribution member 120 to move relative to the support arm 160 such that the second articulating surface 123 is disengaged from the first articulating surface 162. Allowing the fluid distribution member 120 to move relative to the support arm 160 can help prevent inadvertent engagement of the article 110 with the fluid distribution member 120.

It is also possible to provide the non-contact manipulating device 100 without the biasing member 165 in further examples. In such examples, the fluid pressure within the plenum 173 can act to bias the first articulating surface 162 of the support arm 160 against the second articulating surface 123 of the fluid distribution member 120.

As shown in FIGS. 4 and 5A-5E, in one example, the support arm 160 can include at least one first fluid channel 170 in communication with the first fluid port 122. The first fluid channel 170 can have an end 171 configured to engage a coupling (not shown) to provide fluid communication between the first fluid pressure line $L_1$ and the first fluid channel 170. The first fluid channel 170 can include another end 172 in communication with the first fluid port 122 by way of a plenum 173 (see FIG. 5B) defined between the support arm 160 and the fluid distribution member 120. Accordingly, examples of the present invention can provide fluid to the first fluid port 122 by way of a first fluid channel 170 extending at least partially through the support arm 160. The fluid channel can comprise a single or multiple fluid channels located in various positions. In the illustrated example, the first fluid channel 170 comprises a single channel disposed along the central axis 121.

The support arm 160 can include at least one second channel in addition or alternative to the first fluid channel 170. The at least one second channel can comprise a single or multiple channels. For instance, as shown in FIGS. 4 and 5A-5E, the at least one second channel can comprise four channels 180a, 180b, 180c, 180d configured to be placed in fluid communication with the second fluid port 140. As shown, each of the four channels 180a-d can be substantially identical to one another as an equally spaced array of channels about the central axis 121. Although not shown, the channels may comprise different configurations and/or may be different from one another. Furthermore, the channels may be unequally distributed about the central axis and may even extend along the central axis 121 in further examples.

A description of the second fluid channel 180a will now be described with the understanding that such description can also describe the illustrated identical second fluid channels 180b-d. As shown in FIG. 5B, the second fluid channel 180a can include an end 181a configured to engage a coupling (not shown) to provide fluid communication between the second fluid pressure line $L_2$ and the second fluid channel 180a. Thus, a single second pressure line $L_2$ can be configured to equally pressurize each of the second fluid channels 180a-d. As further illustrated in FIG. 5B, the second fluid channel 180a can also include another end 182a that is opened through the first articulating surface 162 of the support arm 160. Thus, the second fluid channel 180a can be configured to extend through the first articulating surface 162 of the support arm 160. As further illustrated in FIG. 5B, the fluid distribution member 120 can also include a fluid channel 184 providing fluid communication between the second fluid channel 180a and a ring chamber 186 behind the second fluid port 140. As shown, each second fluid channel 180a-d can be provided in fluid communication with a corresponding fluid channel 184 through the second articulating surface 123 of the fluid distribution member 120.

The support arm 160 can also include at least one third channel in addition or alternative to the first fluid channel 170 and the second fluid channel 180a-d. The third fluid channel can be considered the second fluid channel in examples not including the second fluid port 140.

The at least one third fluid channel can comprise a single or multiple channels. For instance, as shown in FIGS. 4 and 6A-6C, the at least one third fluid channel can comprise four third fluid channels 190a, 190b, 190c, 190d configured to be placed in fluid communication with a locking device 195. As shown, each of the four third channels 190a-d can be substantially identical to one another as an equally spaced array of channels about the central axis 121. Although not shown, the channels may comprise different configurations and/or may be different from one another. Furthermore, the channels may be unequally distributed about the central axis and may even extend along the central axis 121 in further examples.

Figure 6A:
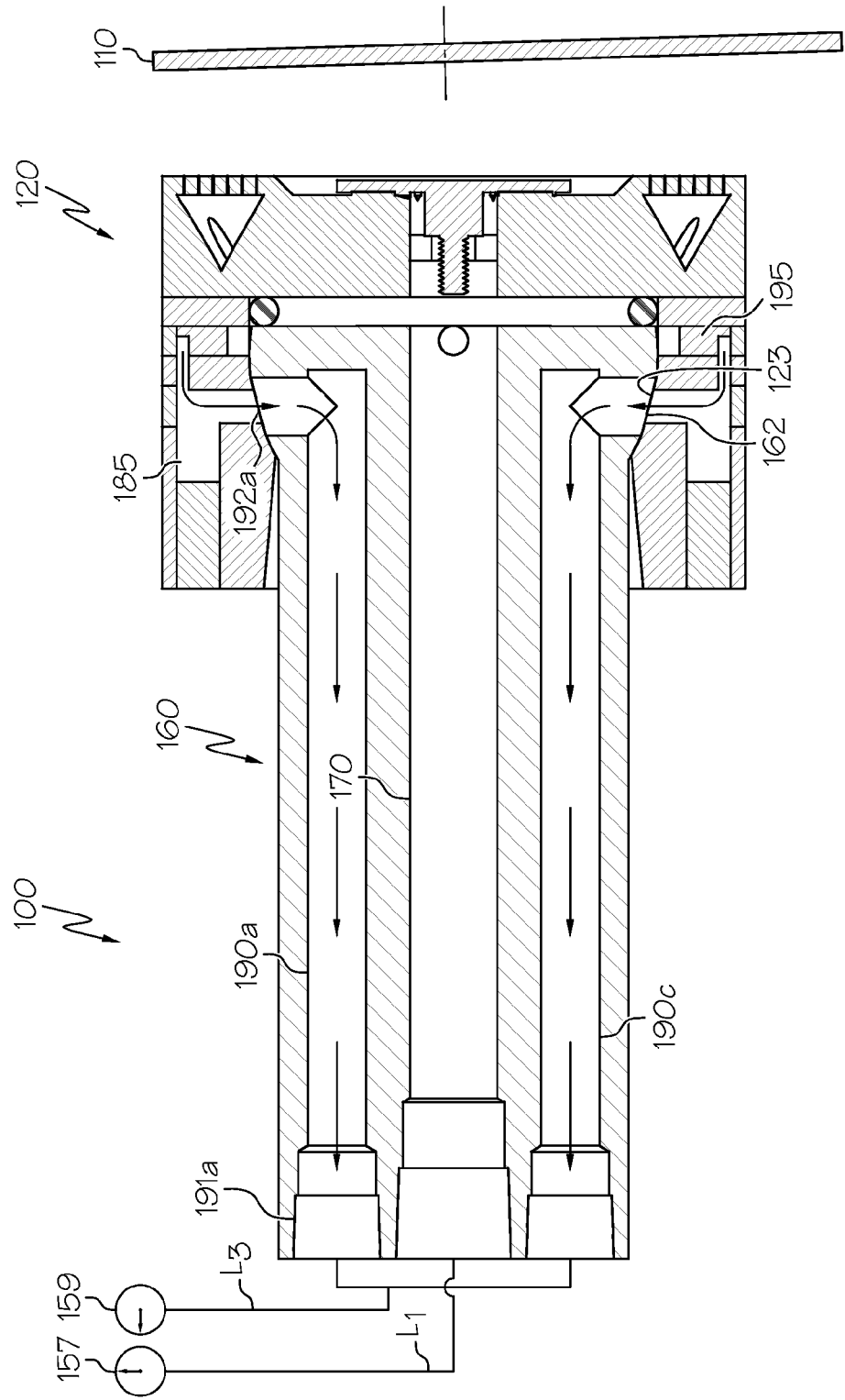
FIGS. 6A-6B are sectional views of the non-contact manipulating device along line 6-6 of FIG. 4 illustrating steps in an example method of articulating a fluid distribution member with respect to a support arm.

A description of the third fluid channel 190a will now be described with the understanding that such description can also describe the illustrated identical third fluid channels 190b-d. As shown in FIG. 6A, the third fluid channel 190a can include an end 191a configured to engage a coupling to provide fluid communication between a third fluid pressure line $L_3$ and the third fluid channel 190a. Thus, a single third fluid pressure line $L_3$ can be configured to equally pressurize each of the third fluid channels 190a-d. As further illustrated in FIG. 6A, the third fluid channel 190a can also include another end 192a that is opened through the first articulating surface 162 of the support arm 160. Thus, the third fluid channel 190a can be configured to extend through the first articulating surface 162 of the support arm 160. As further illustrated in FIG. 6A, the fluid distribution member 120 can also include another fluid channel 185 providing fluid communication between the third fluid channel 190a and the locking device 195. As shown, each third fluid channel 190a can be provided in fluid communication with a corresponding fluid channel 185 open through the second articulating surface 123 of the fluid distribution member 120. Moreover, the locking device 195 can comprise a plurality of engagement pins configured to selectively lock the fluid distribution member 120 at a desired angular position with respect to the support arm 160, wherein the third fluid channels 190a-d are configured to power the corresponding engagement pins.

Figure 6B:
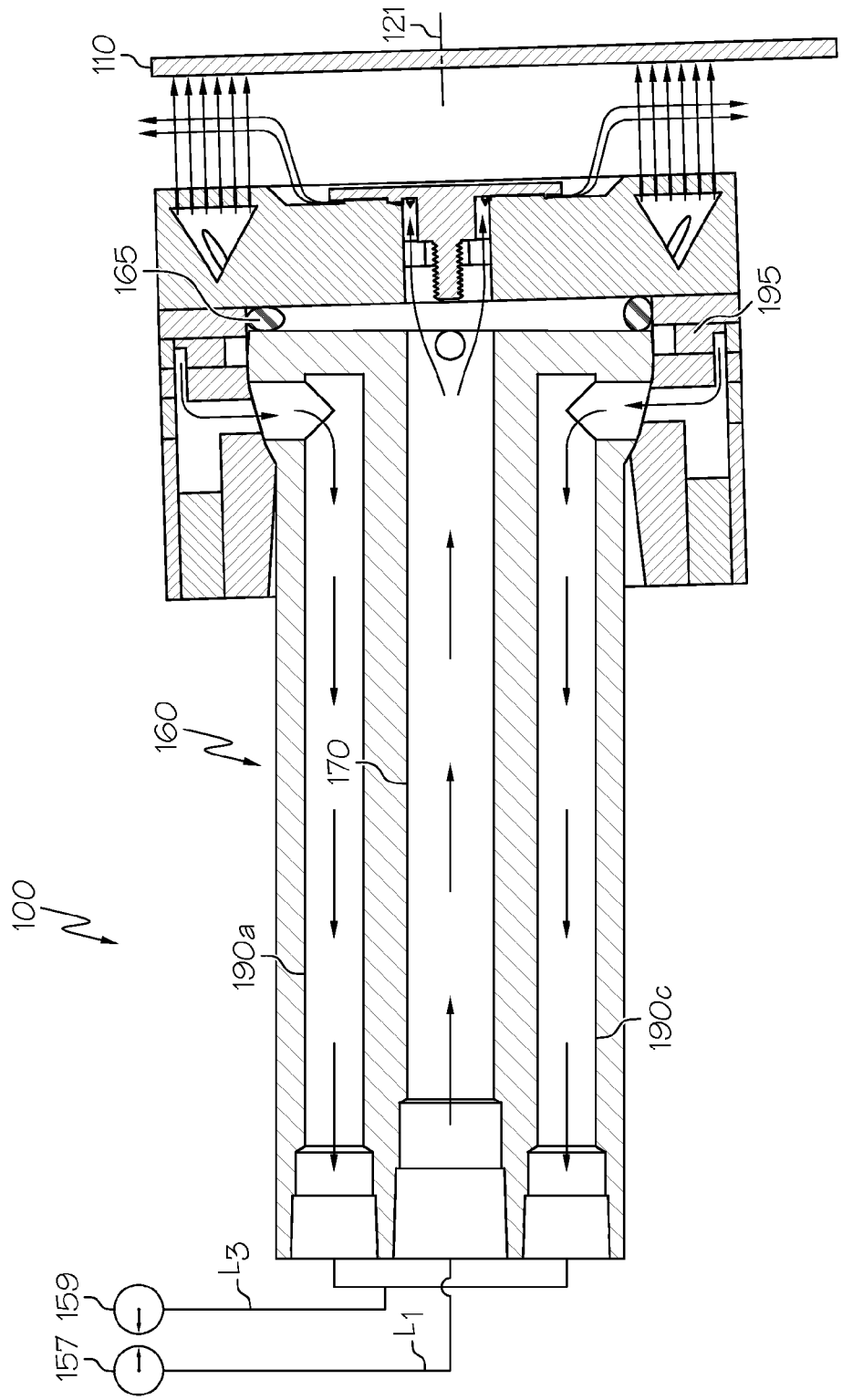
Figure 6C:
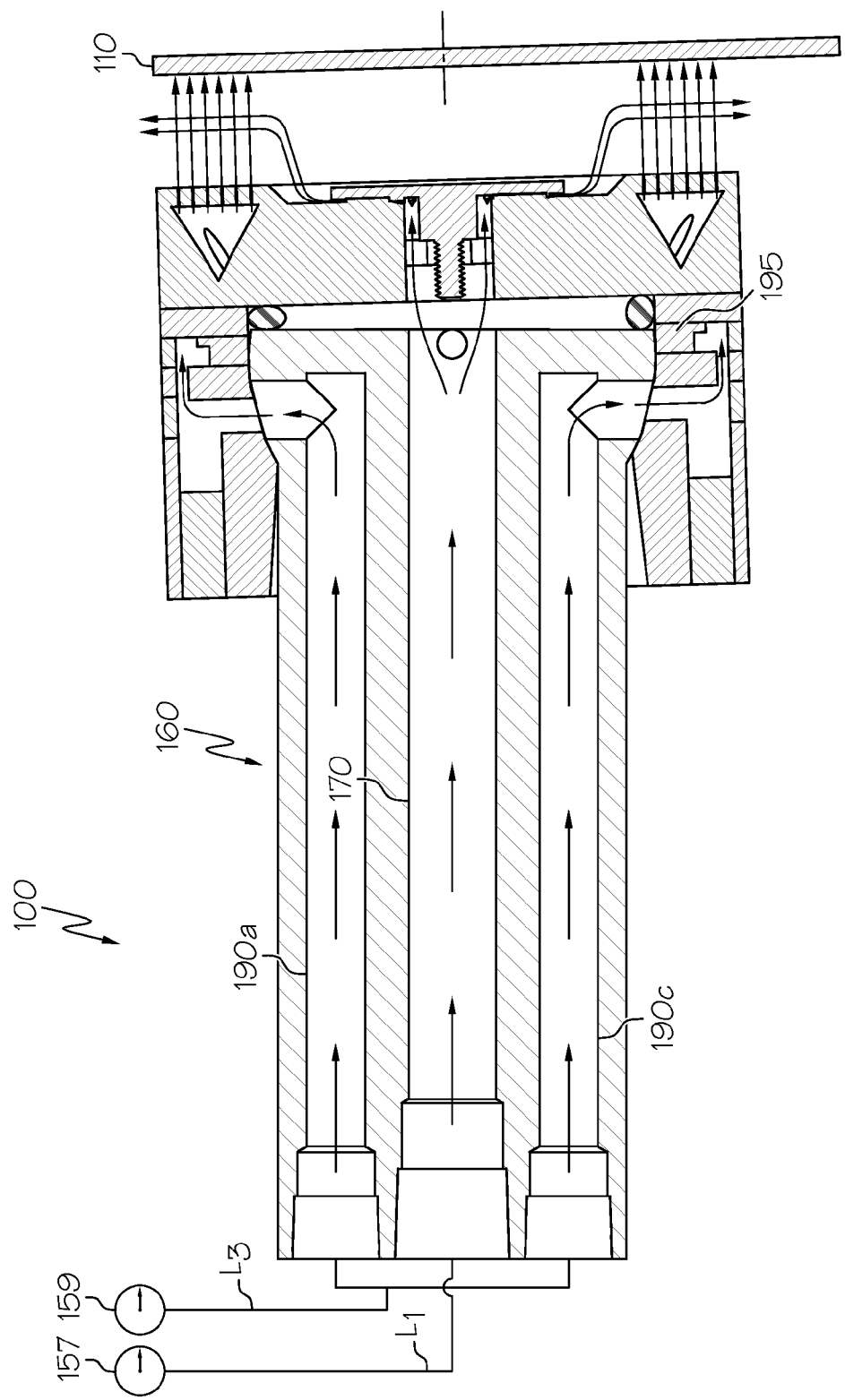
FIG. 6C is a sectional view of the non-contact manipulating device of FIG. 6B with the fluid distribution member being locked with respect to the support arm.

Turning again to FIG. 7, the controller 150 can also be configured to engage and disengage the locking device 195. For example, the controller 150 can include a third fluid pump 174 that can be run in a forward and reverse direction to adjust the pressure within the third pressure line $L_3$. Alternatively, the reversible pump 174 could be two elements in parallel, a vacuum generator and a one-way pump or pressure regulator, with a controllable switch between them. A third pressure gauge 175 can monitor the fluid pressure in the third fluid pressure line $L_3$ and provide pressure feedback by way of feedback path 175a to the computer 154. Based on feedback from the third pressure gauge 175, the computer may modify the third fluid pump 174 in a control loop to achieve the desired fluid pressure. As shown in FIGS. 6A and 6B, the controller 150 can cause the third fluid pump 174 to operate in reverse to provide a negative pressure within the third pressure line $L_3$. As shown, the negative pressure causes each of the engagement pins of the locking device 195 to disengage and pull away from the first articulating surface 162 of the support arm 160, thereby allowing free pivoting of the fluid distribution member 120 with respect to the support arm 160. As shown in FIG. 6C, the controller 150 can also cause the third fluid pump 174 to operate in a forward direction to provide a positive pressure within the third pressure line $L_3$. As shown, the positive pressure causes the engagement pins of the locking device 195 to engage the first articulating surface 162 of the support arm 160 to lock the fluid distribution member 120 at a desired angular position with respect to the support arm 160.

Figure 4:
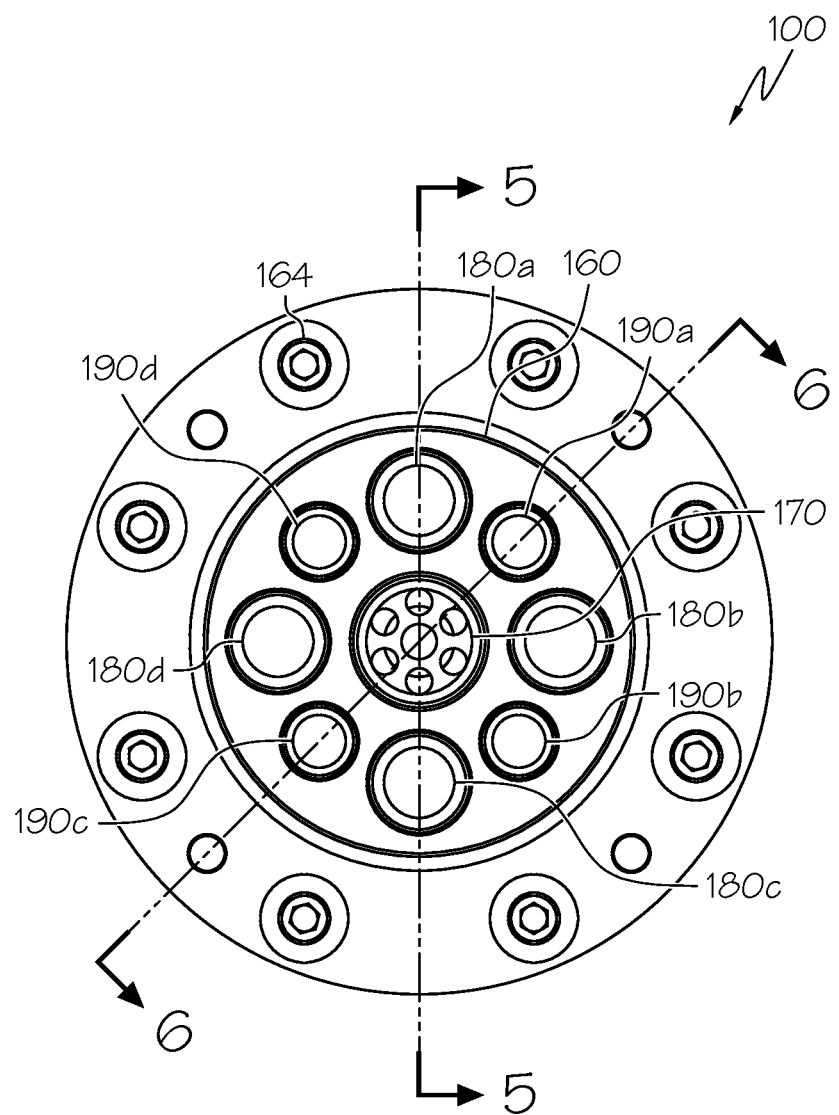
FIG. 4 is a rear view of the non-contact manipulating device of FIG. 1.

As shown in FIGS. 4-6, it will be appreciated that examples of the present invention can include fluid channels 170, 180a-d, 190 a-d configured to provide the non-contact manipulating device 100 with the desired functionality. As shown, the channels can be internal channels to eliminate external hoses that may otherwise restrict pivoting motion of the fluid distribution member 120 which may be especially problematic when conveying hot gas. Indeed, the gases released by the first fluid port and/or the second fluid port may be heated in certain applications such as stabilization of heated material being fusion drawn into a glass sheet.

A method of manipulating an article 110 will now be described with reference to FIGS. 5A-5D. As shown in FIG. 5A, the sensor 152 can be provided to sense the article 110. As shown by the first pressure gauge 157, the first pressure line $L_1$ is operated at a relatively high pressure to maximize the fluid stream 112 exiting the first fluid port 122, thereby providing a maximum possible Bernoulli effect. On the other hand, the second pressure line $L_2$ is operated at a relatively low pressure to minimize the fluid stream 114 exiting the second fluid port 140, thereby minimizing the repelling action of the fluid stream 114.

As shown in FIG. 5B, the sensor 152 can detect when the article 110 is within a distance "D" from the outer surface 130 of the fluid distribution member 120. In response, as shown in FIG. 7, a signal can be sent back along feedback path 152a to the computer 154 that is programmed to respond based on the feedback from the sensor. For example, in response, the computer can send a signal along first command path 156a to cause the first fluid pump 156 to decrease the pressure within the first pressure line $L_1$ to a relatively low pressure. At the same time, the computer can send a signal along second command path 158a to cause the second fluid pump 158 to increase the pressure within the second pressure line $L_2$ to a relatively high pressure. As shown by the first pressure gauge 157 in FIG. 5B, the first pressure line $L_1$ is operated at a relatively low pressure to minimize the fluid stream 112 exiting the first fluid port 122, thereby providing a minimal Bernoulli effect. On the other hand, the second pressure line $L_2$ is operated at a relatively high pressure to maximize the fluid stream 114 exiting the second fluid port 140, thereby maximizing the repelling action of the fluid stream 114. The article 110 is thereby cushioned as it approaches the fluid distribution member 120 to prevent abrupt acceleration from the Bernoulli effect that might otherwise cause contact between the article 110 and the fluid distribution member 120.

FIG. 5C shows the article 110 approaching the fluid distribution member. As the sensor 152 determines that the article 110 is approaching, the controller 150 causes further adjustment in the pressure lines to provide an increased Bernoulli effect by the first fluid port 122 and a decreased repelling force from the second fluid port 140. Finally, as shown in FIG. 5D, the Bernoulli effect can be maximized and the repelling action can be minimized as the article 110 reaches the equilibrium gap distance "d". Once the equilibrium distance "d" is achieved, air from the first fluid port 122 creates the combination of Bernoulli effect which causes the article to be attracted toward the fluid distribution and repelling air pressure which pushes the article away from the fluid distribution member to provide the equilibrium distance "d". Moreover, the further fluid can be dispensed through the second fluid port to shift the equilibrium distance "d" of the article farther away from the fluid distribution member. Alternatively, line $L_2$ may be operated at a relatively high pressure to increase the repelling force, while maintaining line $L_1$ at a relatively high pressure.

Therefore, it will be appreciated that aspects of the present invention can increase the repelling force from the second fluid port 140 as the article 110 approaches the fluid distribution member 120. Increasing the repelling force in this manner can lower the net attraction force, and the corresponding acceleration of the article 110 toward the fluid distribution member 120. Once the article 110 reaches equilibrium with the non-contact manipulating device 100, the fluid being dispensed by the second fluid port 140 can be dialed down or deactivated to reduce the repelling force. Due to the nature of the Bernoulli effect, this produces greater holding stiffness which is manifested in less disturbance of the article by external forces. A variant on this method can involve adjusting the fluid through the second fluid port 140 so that the repelling force exceeds the attraction force of the Bernoulli effect, then moving the non-contact manipulating device 100 close to the article 110 and then gradually reducing the fluid being dispensed through the second fluid port 140. Once the critical point is reached, the attractive force of the Bernoulli section will exceed the repelling force of the second fluid port and the article will be held. The addition of the second fluid port allows power of the Bernoulli section to be reduced with minimal risk of contact. Both of these methods can be reversed in order to release the article 110 in a manner minimizing the risk of contact.

The second fluid port can also be used to compensate for external forces to maintain the desired air gap. If necessary, the Bernoulli section can be turned off to maximize repulsion (e.g., releasing article). In further examples, when movement of the article 110 by moving the manipulating device 100 requires more holding force to prevent the article from being pulled away from the device, the fluid through the second fluid port can be reduced to minimize repelling of the article while fluid through the first fluid port can be increased to enhance the Bernoulli effect.

Figure 8:
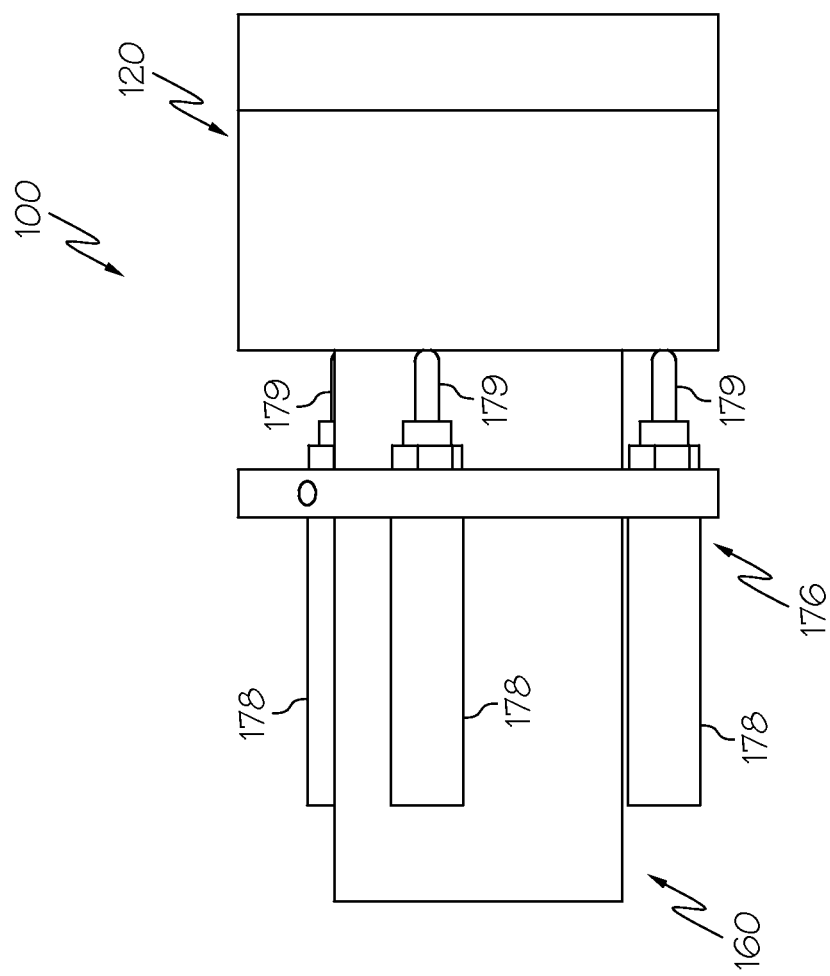
FIG. 8 is a side view of the non-contact manipulating device of FIG. 1 including an example positioning member.

FIG. 8 illustrates the non-contact manipulating device 100 with a positioning member 176 configured to selectively maintain a desired angular position of the fluid distribution member 120 with respect to the support arm 160. As shown, the positioning member 176 can include three actuators 178 of any well known configuration, such as electronically or fluid actuated adjustment screws or pistons 179, arranged to engage the fluid distribution member. It will therefore be appreciated that, with the proper components, the controller 150 can interact with the actuators 179 to articulate the fluid distribution member 120 with respect to the support arm 160. In one example, the positioning member 176 can move the fluid distribution member 120 to orient the article 110 after engagement. For instance, if it picks up skew, it can move skew or reorient to a proper position. In another example, it could also be used to present article 110 to a processing tool at various orientations in a multi-step operation without re-chucking the article.

Figure 9:
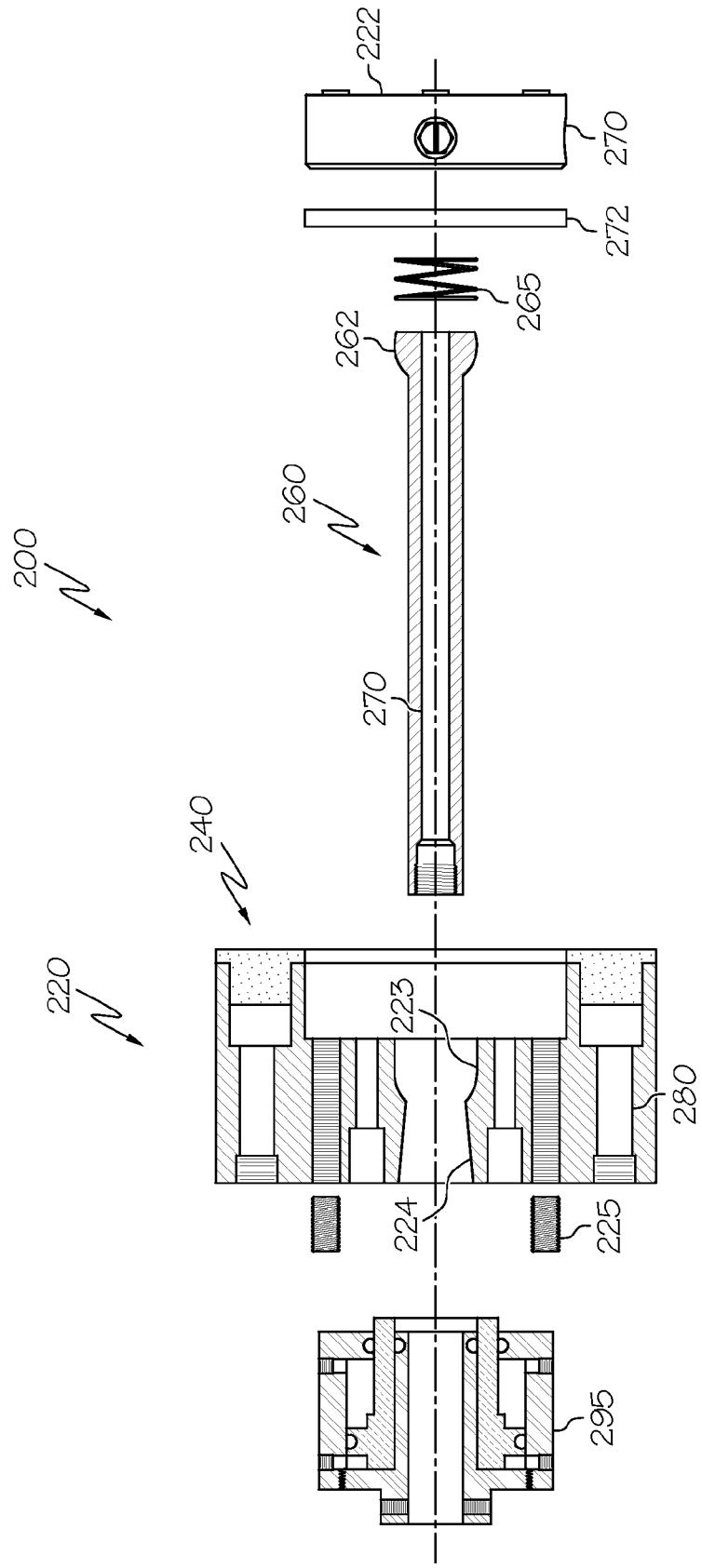
FIG. 9 is an exploded partial sectional view of another non-contact manipulating device incorporating example aspects of the present invention.
Figure 10:
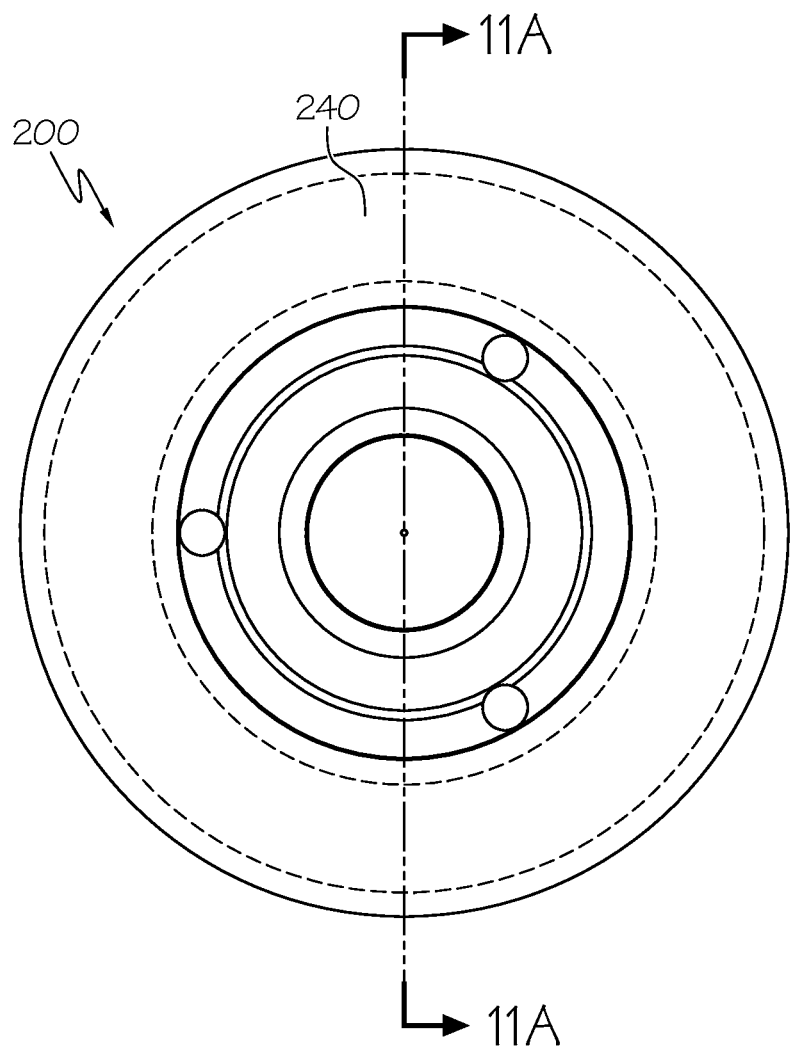
FIG. 10 is front view of the non-contact manipulating device of FIG. 9.
Figure 11A:
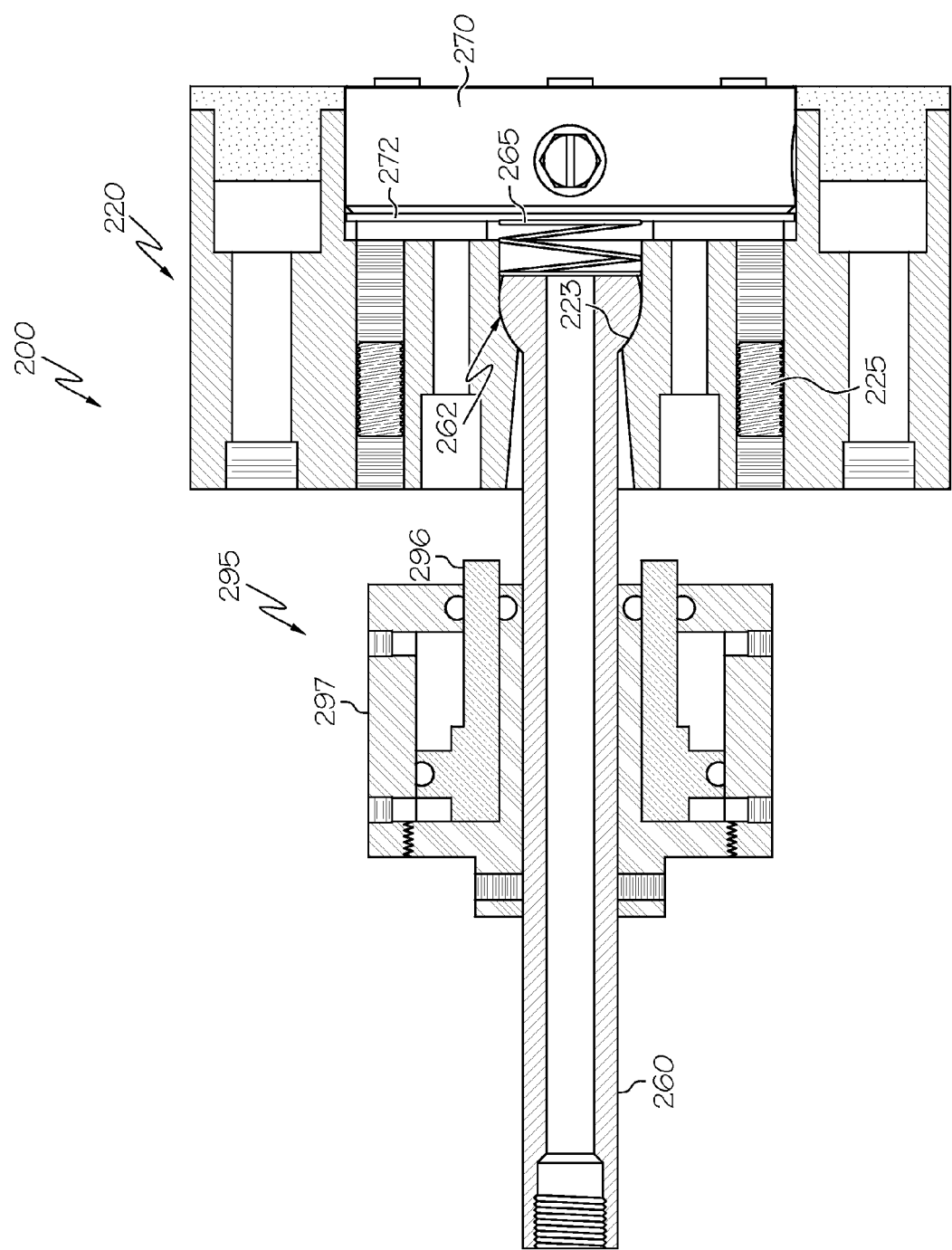
FIG. 11A is a sectional view of the non-contact manipulating device along line 11A-11A of FIG. 10.

FIGS. 9-11 illustrate another example of a non-contact manipulating device 200. As shown, the support arm 260 includes a first articulating surface 262 and a first fluid channel 270. The device 200 further includes a fluid distribution member 220 including a second fluid channel 280 in communication with a second fluid port 240. As shown, the second fluid port 240 can comprise a porous material although other configurations may be used in further examples. All of the fluid distribution members 120, 220 of the present invention can further include a conical area (e.g., see 224 in FIG. 9) to permit articulation of the fluid distribution member 220 with respect to the support arm 260. As shown in FIG. 11A, a first Bernoulli insert 270 and an adapter insert 272 can be inserted within a recess to compress a biasing member 265. The biasing member 265 is configured to compress the first articulating surface 262 against the second articulating surface 223. Balancing screws 225 can also be provided to help adjust the center of gravity, for instance, at the joint between the support arm and the fluid distribution member 220.

Figure 11B:
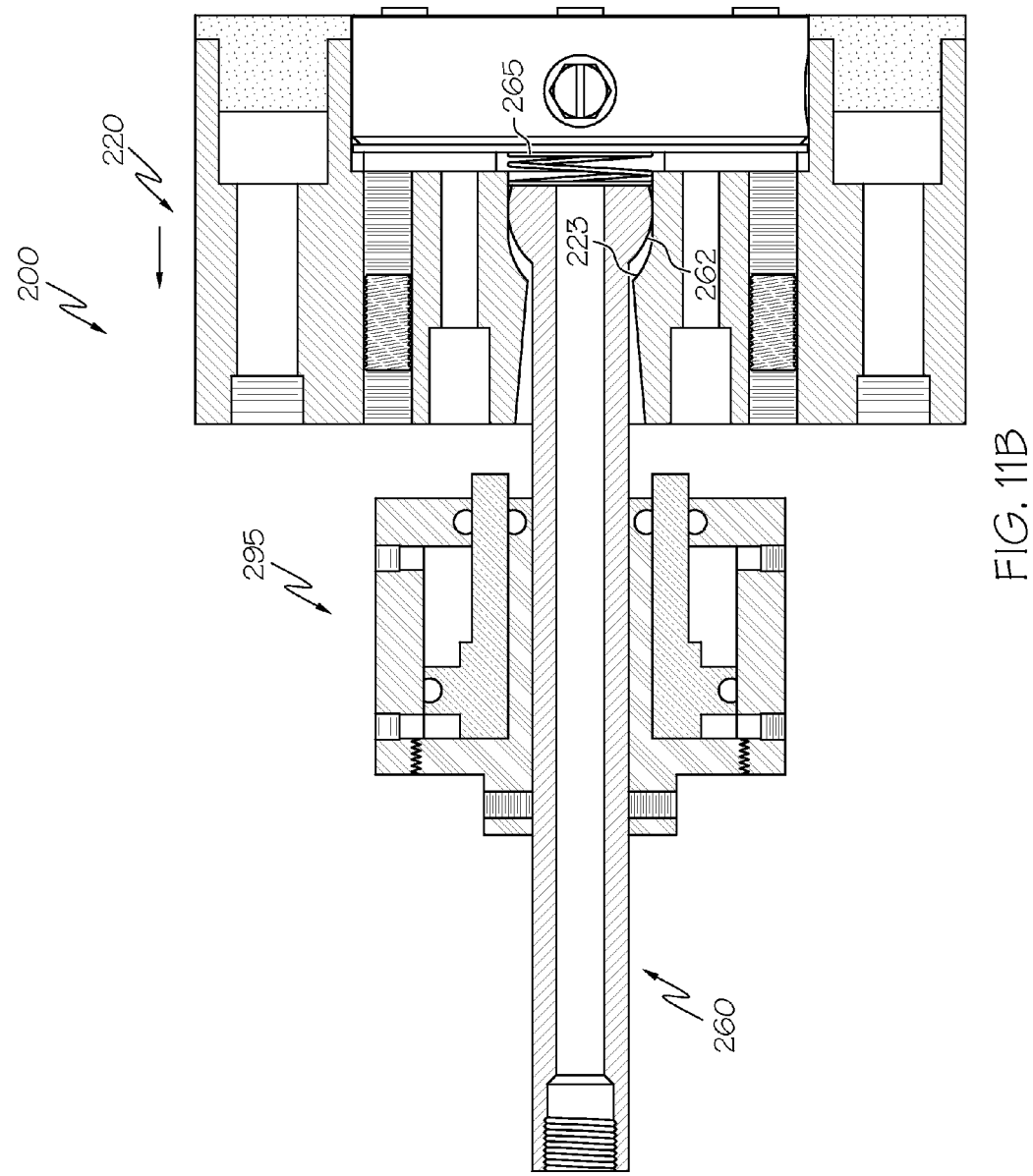
FIG. 11B is a sectional view of the non-contact manipulating device similar to FIG. 11A with a first articulating surface of the support arm being disengaged from a second articulating surface of the fluid distribution member.

Moreover, as shown in FIG. 11B, the biasing member 265 can be compressed to allow the fluid distribution member 220 to move relative to the support arm 260 to disengage the articulating surfaces. Providing for disengagement helps prevent inadvertent contact between the article and the fluid distribution member 220.

The non-contact manipulating device 200 can further include a locking device 295 configured to lock the angular position of the fluid distribution member 220 with respect to the support arm 260. The locking device can include a housing 297 mounted on the support arm 260 and a piston 296 adjustably positioned within the housing. The piston is designed for fluid actuation to extend from the housing and engage the fluid distribution member 220. Once engaged, the fluid distribution member 220 is locked into place.

In operation, fluid can be dispensed through the first fluid port 222 to produce a desired Bernoulli effect. Fluid can also be dispensed through the second fluid port 240 to repel the article way from the fluid distribution member 220. Accordingly, a balance of forces can exist to provide a desired equilibrium gap. Moreover, as with the device 100, the device 200 can be operable by a controller in order to minimize the possibility of the article from engaging the fluid distribution member.

As shown, the non-contact manipulating devices 100, 200 comprise a single fluid distribution member and support arm. In further examples, two or more fluid distribution members and support arms may be used. For instance, an array, such as a matrix, of fluid distribution members/support arms can be used. In such an example, the array can be designed for simultaneous movement or can be designed to be independently moved in and out and can push and/or pull on the article (e.g., sheet) in different manners. For example, the array of devices can be designed to push and pull on a sheet of glass coming out of a fusion draw to impart a longitudinal bow in the glass to stiffen the sheet during forming, cut down on vibrations, etc. The devices may also be used during score and breaking to stabilize the middle of the sheet and to remove glass sheets separated from the ribbon.

Devices in accordance with the present invention can be made from stainless steel or other material designed to withstand high temperature applications. In further examples, the devices can be made from other materials such as various resins, polymers, composites or other materials depending on the application. Moreover, the components, all or in part, can be manufactured through an additive process such as stereo lithography or direct metal laser sintering.

Various fluids may be used with the non-contact manipulating device. For instance, the fluid may comprise a liquid or a gas. In one example, the fluid can comprise air or may comprise nitrogen or other gas types. These fluids may also be treated so that they do not contaminate the articles under manipulation.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A method of manipulating an article comprising the steps of:
   providing a non-contact manipulating device including a first fluid port and a second fluid port;
   creating a Bernoulli effect by supplying a first flow of fluid through the first fluid port to attract an article to be manipulated by the manipulating device while maintaining a gap between the article and the fluid distribution member;
   helping to maintain the gap by supplying a second flow of fluid through a second fluid port;
   selectively increasing and decreasing at least one of the first flow of fluid and the second flow of fluid to help maintain the gap;
   accelerating the non-contact manipulating device to move the article;
   sensing the acceleration of the non-contact manipulating device; and
   selectively increasing and decreasing the second flow of fluid in response to the sensed acceleration;
   wherein a total flow of fluid comprises the first flow of fluid and the second flow of fluid; and
   the step of selectively increasing and decreasing the total flow of fluid comprises selectively increasing and decreasing the second flow of fluid while accelerating to help maintain the gap.

2. The method of claim 1, wherein the step of selectively increasing and decreasing the total flow of fluid comprises selectively increasing and decreasing the first flow of fluid.

3. The method of claim 2, wherein the step of selectively increasing and decreasing the total flow of fluid further comprises selectively increasing and decreasing the second flow of fluid.

4. The method of claim 1, wherein the step of selectively increasing and decreasing the total flow of fluid comprises selectively increasing and decreasing the second flow of fluid.

5. The method of claim 1, wherein, as the article approaches the noncontact manipulating device, the step of selectively increasing and decreasing the total flow of fluid comprises increasing the first flow of fluid.

6. The method of claim 5, wherein, as the article approaches the non-contact manipulating device, the step of selectively increasing and decreasing the total flow of fluid further comprises decreasing the second flow of fluid.

7. The method of claim 6, further comprising, when the approaching article reaches a predetermined first distance from the non-contact manipulating device, increasing the second flow of fluid.

8. The method of claim 7, wherein the step of selectively increasing and decreasing the fluid flow through the second fluid port as the article approaches further comprises the step of decreasing the fluid flow through the second fluid port when the approaching article is within a second pre determined distance from the non-contact manipulating device that is less than the first pre-determined distance.

9. The method of claim 5, further comprising, when the approaching article reaches a predetermined distance from the non-contact manipulating device, increasing the second flow of fluid.

10. The method of claim 1, wherein, as the article approaches the non-contact manipulating device, the step of selectively increasing and decreasing the total flow of fluid comprises increasing the second flow of fluid.

11. The method of claim 10, wherein, when the articles reaches a predetermined distance from the non-contact manipulating device, decreasing the second flow of fluid.

12. The method of claim 1, wherein, as the article approaches the non-contact manipulating device, the step of selectively increasing and decreasing the total flow of fluid comprises:
   increasing the second flow of fluid so that a repellant force applied by the second flow of fluid to the article exceeds the attraction force applied to the article by the Bernoulli effect of the first flow of fluid; and
   then gradually decreasing the second flow of fluid until the repellant force applied by the second flow of fluid to the article equals the attraction force applied to the article by the Bernoulli effect of the first flow of fluid.

* * * * *